US006865274B1

(12) United States Patent
Aarts et al.

(10) Patent No.: US 6,865,274 B1
(45) Date of Patent: Mar. 8, 2005

(54) LOUDSPEAKER PRODUCTION SYSTEM HAVING FREQUENCY BAND SELECTIVE AUDIO POWER CONTROL

(75) Inventors: Ronaldus Maria Aarts, Eindhoven (NL); Joris Adelbert Maria Nieuwendijk, Eindhoven (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 672 days.

(21) Appl. No.: 09/786,293

(22) PCT Filed: Jun. 27, 2000

(86) PCT No.: PCT/EP00/05962

§ 371 (c)(1), (2), (4) Date: Mar. 1, 2001

(87) PCT Pub. No.: WO01/03466

PCT Pub. Date: Jan. 11, 2001

(30) Foreign Application Priority Data

Jul. 2, 1999 (EP) .......................................... 99202162

(51) Int. Cl.[7] .............................................. H03G 11/00

(52) U.S. Cl. .......................................... 381/55; 381/98

(58) Field of Search ......................... 381/53, 104, 105, 381/107, 99, 98

(56) References Cited

U.S. PATENT DOCUMENTS

| | | | | | |
|---|---|---|---|---|---|
| 4,454,609 | A | * | 6/1984 | Kates | 381/320 |
| 4,583,245 | A | * | 4/1986 | Gelow et al. | 381/59 |
| 4,783,819 | A | * | 11/1988 | De Koning et al. | 381/83 |
| 4,944,015 | A | * | 7/1990 | Juve et al. | 381/55 |
| 5,528,695 | A | * | 6/1996 | Klippel | 381/55 |
| 5,548,650 | A | * | 8/1996 | Clark | 381/55 |
| 5,923,768 | A | * | 7/1999 | Frindle et al. | 381/106 |
| 6,005,953 | A | * | 12/1999 | Stuhlfelner | 381/94.3 |

FOREIGN PATENT DOCUMENTS

DE 2415816 A1 10/1975

* cited by examiner

*Primary Examiner*—Xu Mei
*Assistant Examiner*—Brian T. Pendleton
(74) *Attorney, Agent, or Firm*—Edward W. Goodman

(57) ABSTRACT

A loudspeaker protection system includes a filter arrangement for defining one or more frequency bands of an audio signal, controllable amplifier/attenuator combinations coupled to the filter arrangement, and a processing arrangement coupled to control the amplifier/attenuator combinations, such as to determine audio power in at least one of the frequency bands representing relevant loudspeaker protection information used for selective audio power control in the at least one frequency band. This system has the features for a fast and/or slow thermal protection, as well as for a cone excursion protection, all for a loudspeaker in such a system.

7 Claims, 1 Drawing Sheet

LOUDSPEAKER PRODUCTION SYSTEM HAVING FREQUENCY BAND SELECTIVE AUDIO POWER CONTROL

BACKGROUND OF THE INVENTION

1. Field of the Invention

The present invention relates to a loudspeaker protection system comprising filter means for defining one or more frequency bands of an audio signal.

The present invention also relates to a audio set provided with a loudspeaker protection system.

2. Description of the Related Art

Such a loudspeaker protection system is known from German Offenlegungsschrift DE-AS 24 15 816, and can be applied in compact, small size, so-called micro, mini or midi audio sets. The known loudspeaker protection system comprises respective bandwidth controllable filter means, whose individual bandwidths, in particular, in the low and high frequency bands, are controllable by means of a control means coupled to the loudspeaker of the system. In order to thermally protect the loudspeaker against short or long lasting overload, the filter means can be influenced by decreasing the output level of the audio signal for the loudspeaker. Merely decreasing the loudspeaker output level within, e.g., a bass frequency range may provide some protection, but, at the same time, it is a disadvantage of the known loudspeaker protection system that it sacrifices loudspeaker output power unnecessarily and thus fails to make effective use of available loudspeaker output power. In addition, this sacrifice of output power is a major commercial disadvantage, in particular, for the younger-aged target group of these audio sets.

SUMMARY OF THE INVENTION

Therefore it is an object of the present invention to provide a loudspeaker protection system, which is made effective for the specified purpose of protecting the loudspeaker only, without unnecessary affecting the full power range available for the loudspeaker.

Therefore, the loudspeaker protection system according to the present invention is characterized in that the loudspeaker protection system further comprises controllable amplifier/attenuator means coupled to the filter means, and processing means coupled to control the amplifier/attenuator means, such as to determine audio power in at least one of said frequency bands representing relevant loudspeaker protection information used for selective audio power control in said at least one frequency band.

By determining the respective audio output powers for the loudspeaker in respective frequency bands, accurate information becomes available about the variety of sources of dangers which are connected to loudspeakers, such as, short- and long-term overload, as well as excessive excursion or displacement of the loudspeaker cone or coil, which is a well-known source of all kinds of distortion in reproduced loudspeaker sounds. Thus, a multi-purpose loudspeaker protection system is made available, which can be dedicated to its specific protection functions without unnecessary affecting the full power range available for the loudspeaker. Audio power in respective frequency bands has thus proven to provide a reliable source of loudspeaker protection information, so that no audio output power is sacrificed needlessly and the maximum audio output performance can be delivered without endangering the loudspeaker.

One embodiment of the loudspeaker protection system according to the invention is characterized in that the processing means are equipped to determine the audio power $S_j$ in frequency band j in proportion to:

$$V_{jtop}{}^{2}*R\{Y_j\},$$

where $v_{jtop}$ is the peak value of the amplitude of the frequency components in frequency band j, and $R\{Y_j\}$ is the real part of the electric admittance of the loudspeaker in frequency band j.

Advantageously, $v_{jtop}$ can be derived from the respective outputs of the amplifier/attenuator means, and $R\{Y_j\}$ can either be estimated or predicted, or can, more accurately, actually be measured in a further embodiment by means of a measuring element arranged in series with the loudspeaker.

A further embodiment of the loudspeaker protection system according to the invention is characterized in that in the loudspeaker protection system, j=1, 2, 3 . . . n, where n equals the number of frequency bands wherein the frequency spectrum of the audio signal is divided.

Starting with j=1, which is the frequency band containing the lowest frequency components of the audio signal, this band contains relevant information which is a good estimate for the resistance of the voice coil of the loudspeaker. This resistance depends on and generally increases with the actual temperature of the voice coil. Hence, the information contained in audio power $S_1$ may be used to activate the amplifier/attenuator means to function as a slow term thermal protection. Similarly, audio power $S_2$, for example, containing frequency components around the so-called Helmholtz frequency (e.g., between 25 Hz and 85 Hz for a bass reflex loudspeaker system), provides accurate information about the actual excursion of the cone of the loudspeaker. So the information contained in audio power $S_2$ may be used to activate the amplifier/attenuator means to function as a fast cone excursion protection.

A still further embodiment of the loudspeaker protection system according to the invention is characterized in that the processing means are capable of summing $S_j$ over a specified subrange of possible values of j, where j is in the range from 1, 2, . . . n.

Advantageously, summing $S_j$ over possibly all values from 1 to n reveals a value of S which represents information about the instantaneous electrical dissipation in the loudspeaker. Hence, the information contained in S may be used to activate the amplifier/attenuator means to function as a fast thermal protection.

In practice, some sensible and fast enough summed value or combination of values $S_j$ will be used so that if these respective values approximate some normalized individual value $S_{norm}$, the amplifier/attenuator means are controlled by the processing means to take proper action to protect the loudspeaker.

In a still further embodiment of the invention, by determining $S_j$ or any summation thereof every 0.001–2 sec., or in particular every 0.1–1 sec., updated data are derived such that an accurate and reliable protection is available at all times. Advantageously, the present invention can be applied not only in the low frequency range for bass loudspeakers, but also for midrange and high-range (tweeter) loudspeakers.

Principally, various values and value control methods are possible for the amplifier/attenuator means, but preferably, in another embodiment of the loudspeaker protection system, they are controlled by the processing means such that attenuation factors of the amplifier/attenuator means are proportional to:

$$1/\sqrt{\alpha}+\beta_j(1-1/\sqrt{\alpha})$$

where $\alpha=S/S_{norm}$, and $\beta_j$ represents a factor whose value depends empirically on the particular frequency band j.

Still another embodiment of the loudspeaker protection system according to the invention is characterized in that the loudspeaker protection system comprises a series arrangement of the loudspeaker and a measuring element, such as a resistance, coupled to ground, in which a common connection point is coupled to the processing means to account for actual impedance data of the loudspeaker.

Advantageously, measurement of actual impedance data of the loudspeaker improves reliability and accuracy of the protection system.

It is preferred that the processing means is arranged to initiate control in a shorter amount of time than the time during which the control is withdrawn.

An advantage is that this way of starting and completing control is less audible and disturbing for the human ear.

BRIEF DESCRIPTION OF THE DRAWING

Herein, the loudspeaker protection system according to the invention will be elucidated further together with its additional advantages while reference is being made to the appended drawing, in which.

DESCRIPTION OF THE PREFERRED EMBODIMENTS

Figure 1:
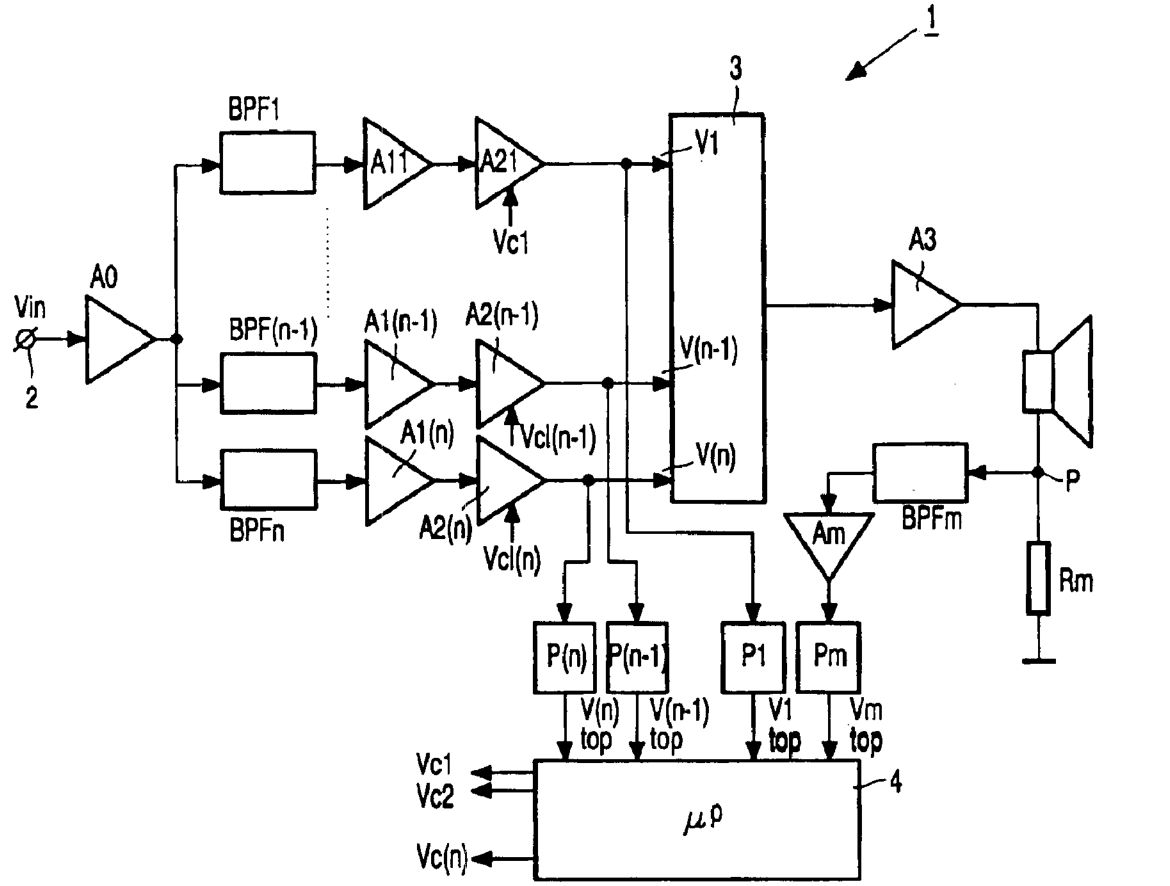
FIG. 1 shows a schematic representation illustrating possible embodiments of the loudspeaker protection system according to the present invention.

FIG. 1 shows a loudspeaker protection system 1 in accordance with the invention. The system 1 comprises an audio signal input terminal 2 connected to a dividing amplifier A0, which is connected to a parallel arrangement of filter means of the system 1, this filter means being arranged as band-pass filters BPF1–BPF(n−1), and possibly BPF(n), whereby the latter may be a high-pass filter. Each of the respective filter means BPF is connected to controllable amplifier/attenuator means, shown as separate amplifiers A11–A1 (*n*) and attenuators A21–A2(*n*). Each of the amplifier/attenuator means is provided with a control input Vc1–Vc(n), such that the amplification or attenuation of the amplifier/attenuator means can be controlled in dependence on the respective control signals thereon. Output signals designated v1–v(n) are applied as inputs to an adder 3, which, in turn, is connected to an amplifier A3 and then to a loudspeaker LS coupled to ground. The system 1 comprises processing means 4 fed by the output signals v1–vn through peak-value detectors P1–Pn. The peak-value detectors P1–Pn finally input signals V1–Vn, which are representative of the peak values of the output signals v1–vn. The processing means 4 provides control signals Vc1–Vc(n−1) to the correspondingly designated control inputs of the amplifier/attenuator means. Additionally, in a further embodiment of the loudspeaker protection system 1, further control information may be derived from a measuring element, such as a resistor Rm, which, through a further band-pass filter BPMm, an amplifier Am and a further peak detector Pm, provides control information to the processing means 4. Principally, all constituting elements of the loudspeaker protection system 1 can be implemented in either an analog, or digital, or hybrid way, whereby conversion takes place by means of suitable A/D and D/A converters and, where possible, multiplexers are applied to reduce the number of necessary converters. The processing means 4 can be implemented by means of a properly programmed processor, such as a microprocessor or computer.

The functioning of the loudspeaker protection system 1 is as follows. The audio signal on input terminal 2 is divided in separate frequency bands by the filter means BPF1–BPFn. The audio power $S_j$ in each of the frequency bands j is calculated repeatedly by the processing means 4 in the embodiment as shown using the formula:

$$S_j=v_{jtop}^2*R\{Y_j\}*(A_3)^2,$$

where $v_{jtop}$ is the peak value of the amplitude of the frequency components in frequency band j, $R\{Y_j\}$ is the real part of the electric admittance of the loudspeaker in frequency band j and $A_3$ is the gain of amplifier A3. The latter may come from a table with pre-measured data concerning the electric admittance of the loudspeaker LS concerned, or may be actually measured by means of the measuring element Rm, which will be elucidated later. The number n of frequency bands may, for example, be between 2 and 8. The lowest frequency band contains information in the form of the audio power $S_1$ present therein, which is a good estimate for the resistance of the voice coil of the loudspeaker. This resistance increases with the actual temperature of the voice coil. If, in an audio signal at a certain moment, audio power $S_1$ exceeds a normalized loudspeaker value $S_{norm}$, then the amplifier/attenuator means are activated by the processing means 4 and the control signal Vc1 is influenced to decrease the audio power $S_1$, which reduces critical audio power to the loudspeaker, such that a long-term (slow) thermal protection thereof is achieved. The output audio power $S_1$ is controllably reduced as far as necessary for protection of the loudspeaker LS, whose full power range can thus safely be used.

Figure 2:
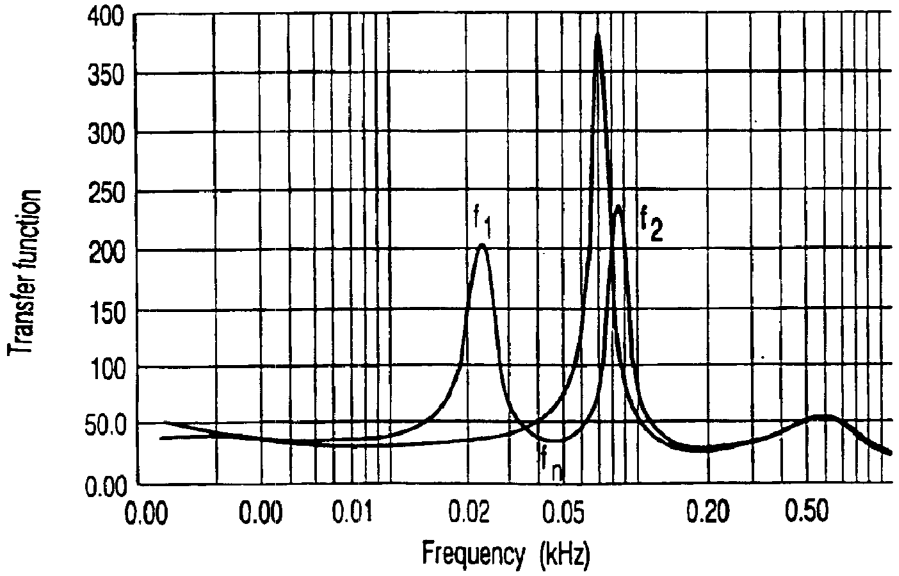
FIG. 2 shows graphs of the impedance versus frequency of two types of loudspeakers.

Similarly audio power $S_2$, for example, containing frequency components around the so-called Helmholtz frequency and above (e.g., between 25 Hz and 85 Hz for a bass reflex loudspeaker system), provides accurate information about the actual excursion of the cone of the loudspeaker. An example of an Helmholtz band and Helmholtz frequency $f_H$ is shown in FIG. 2 between $f_1$ and $f_2$. The one peak curve as shown is representative for a normal loudspeaker system. Hence, the information contained in audio power $S_2$ in the form of audio output power around the Helmholtz frequency, may be used to activate the amplifier/attenuator means to function as a fast cone excursion protection. If the audio power $S_2$ exceeds a predetermined level, then this is an indication that the voice coil is moving out of its magnetic field and an unwanted large excursion arises. Cone protection is achieved by allowing the processing means 4 to control the output power in audio power $S_2$ such that it is lowered to an extend that said predetermined level is not exceeded for the particular loudspeaker. Of course, any suitable combination of frequency bands $S_j$ may be used and/or summed to provide the wanted information about excessive cone excursions.

The following protection that may achieved is a long range or fast thermal protection, protecting against high-level peaks in the audio signal for the loudspeaker. This can take place by determining, in the processing means 4, the sum S of audio power $S_j$ in several frequency bands by:

$$S=\Sigma v_{jtop}^2*R\{Y_j\}*(A_3)^2.$$

If S exceeds a further normalized predetermined value, then control action is taken by the processing means 4 such that finally S decreases and the summed, possibly total, audio power in the loudspeaker decreases, which protects the loudspeaker LS against instantaneous high-level audio peaks. The processing means 4 is capable to determine $S_j$ or any summation S thereof every 0.001–2 sec., and more particularly, every 0.1–1 sec. This will generally depend on the expected variations in the audio signal and on the speed of the hardware and software needed to program the processing means 4 properly. Of course, any of the above described protection methods may be combined and performed in any obvious way for either bass, mid-range, or high-range loudspeakers.

Control of the attenuation factors Vc1–Vcn will take place gently in order not to attenuate the audio signal too much, and such that the full power range of the loudspeaker LS is still usable. A possible way of control is that the amplifier/attenuator means are controlled by the processing means such that the attenuation factors of the amplifier/attenuator means are proportional to:

$$1/\sqrt{\alpha}+\beta_j(1-1/\sqrt{\alpha})$$

where $\alpha=S/S_{norm}$, $S_{norm}$ represents the further normalized predetermined value of S, and $\beta_j$ represents a factor whose value depends empirically on the particular frequency band j. For example, $\beta_j$ may be chosen 0, ¼, 2/4, ¾, 1. Herein, S may be summed over one or more frequency bands. For example, attenuation (or inverse amplification) in the amplifier/attenuator means can be even more gradually adjusted proportional to:

$$\{\tau^x+\beta_j(1-\tau^x)\}\{1/\sqrt{\alpha}+\beta_j(1-1/\sqrt{\alpha})\}$$

where, for fast thermal protection, $\tau$ exceeds 1 and x is a constant to be determined empirically. Generally, it is preferred, for human perception reasons, that the processing means 4 is arranged to initiate control in a shorter amount of time than that during which the control is withdrawn.

In the above-mentioned further embodiment, the loudspeaker protection system 1 comprises the measuring element Rm. The data concerning the instantaneous impedance and voltage across the element Rm on, for example, common connection point P can be used by the processing means 4, instead of corresponding data in a memory table of the processing means 4, to have actual, and thus more accurate and reliable, values available for each possible combination of the above mentioned protection methods.

What is claimed is:

1. A loudspeaker protection system comprising:

filter means for defining one or more frequency bands of an audio signal;

controllable amplifier/attenuator means coupled to the filter means; and processing means coupled to control the amplifier/attenuator means, such as to determine audio power in at least one of said frequency bands representing relevant loudspeaker protection information used for selective audio power control in said at least one frequency band;

characterized in that the processing means determines the audio power $S_j$ in frequency band j in proportion to:

$$v_{jtop}^{2}*R\{Y_j\},$$

where $v_{jtop}$ is the peak value of the amplitude of the frequency components in frequency band j, and $R\{Y_j\}$ is the real part of the electric admittance of the loudspeaker in frequency band j, and the processing means sums the audio power $S_j$ in the plurality of frequency bands over a specified sub-range of possible values of j, where j ranges from 1, 2, . . . n.

2. The loudspeaker protection system as claimed in claim 1, characterized in that if any summed value or combination of values $S_j$ approximates a normalized value $S_{norm}$, the processing means then controls the amplifier/attenuator means.

3. The loudspeaker protection system as claimed in claim 1, characterized in that the processing means determines $S_j$ or any summation thereof every 0.001–2 sec.

4. The loudspeaker protection system as claimed in claim 3, characterized in that the processing means determines $S_j$ or any summation thereof every 0.1–1 sec.

5. The loudspeaker protection system as claimed in claim 2, characterized in that the processing means controls the amplifier/attenuator means such that attenuation factors of the amplifier/attenuator means are proportional to:

$$1/\sqrt{\alpha}+\beta_j(1-1/\sqrt{\alpha})$$

where $\alpha=S/S_{norm}$, S is the summed value, and $\beta_j$ represents a factor having a value depending empirically on the particular frequency band j.

6. A loudspeaker protection system comprising:

filter means for dividing a frequency spectrum of an input audio signal into a plurality of frequency bands;

controllable amplifier/attenuator means coupled to the filter means; and processing means for controlling the amplifier/attenuator means, said processing means determining audio power in said frequency bands representing relevant loudspeaker protection information, and selectively controlling said controllable amplifier/attenuator means in response to the determined audio power in at least one of said plurality of frequency bands, characterized in that output means of said amplifier/attenuator means is coupled to a first terminal of a loudspeaker, and the loudspeaker protection system further comprises a measuring element coupling a second terminal of the loudspeaker to ground, a common connection point between the loudspeaker and the measuring element being coupled to the processing means, whereby actual impedance data of the loudspeaker as determined by the measuring element is taken into account by the processing means.

7. The loudspeaker protection system as claimed in claim 6, wherein said measuring element is a resistor.

* * * * *